(12) United States Patent
Konstantinov (10) Patent No.: US 9,608,056 B2
(45) Date of Patent: Mar. 28, 2017

(54) SCHOTTKY-BARRIER DEVICE AND RELATED SEMICONDUCTOR PRODUCT

(71) Applicant: FAIRCHILD SEMICONDUCTOR CORPORATION, San Jose, CA (US)

(72) Inventor: Andrei Konstantinov, Sollentuna (SE)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/750,682

(22) Filed: Jun. 25, 2015

(65) Prior Publication Data

US 2015/0295023 A1     Oct. 15, 2015

Related U.S. Application Data

(63) Continuation of application No. 13/920,933, filed on Jun. 18, 2013, now Pat. No. 9,105,557.

(Continued)

(51) Int. Cl.

| | |
|---|---|
| *H01L 29/06* | (2006.01) |
| *H01L 29/10* | (2006.01) |
| *H01L 29/16* | (2006.01) |
| *H01L 29/87* | (2006.01) |
| *H01L 21/30* | (2006.01) |
| *H01L 21/02* | (2006.01) |
| *H01L 21/302* | (2006.01) |
| *H01L 21/3065* | (2006.01) |
| *H01L 29/872* | (2006.01) |

(52) U.S. Cl.
CPC .... *H01L 29/0619* (2013.01); *H01L 21/02529* (2013.01); *H01L 21/302* (2013.01); *H01L 21/3065* (2013.01); *H01L 29/0692* (2013.01); *H01L 29/1095* (2013.01); *H01L 29/1608* (2013.01); *H01L 29/872* (2013.01)

(58) Field of Classification Search
CPC ............. H01L 29/0619; H01L 29/1095; H01L 29/0692; H01L 29/872; H01L 21/3065; H01L 21/302; H01L 21/02529; H01L 29/1608
USPC ..................................... 257/77; 438/105, 931
See application file for complete search history.

(56) References Cited

U.S. PATENT DOCUMENTS

| | | | |
|---|---|---|---|
| 6,404,033 B1 * | 6/2002 | Chang ................... | H01L 29/872 257/471 |
| 6,734,461 B1 | 5/2004 | Shiomi et al. | |

(Continued)

FOREIGN PATENT DOCUMENTS

WO     2012/120749 A1     9/2012

OTHER PUBLICATIONS

B. Van Zeghbroeck, Principles of Semiconductor Devices, Chapter 4: p-n Junctions, Section 4.5: Reverse bias breakdown, 2011.*

(Continued)

*Primary Examiner* — John C Ingham
*Assistant Examiner* — Didarul Mazumder
(74) *Attorney, Agent, or Firm* — Brake Hughes Bellermann LLP (57) ABSTRACT

In one general aspect, a power rectifier device can include a drift layer including silicon carbide of n-type conductivity, and a Schottky electrode disposed on the drift layer where the Schottky electrode and a surface of the drift layer can provide a Schottky contact. The power rectifier device can also include an array of p-type regions disposed underneath the Schottky electrode.

18 Claims, 4 Drawing Sheets

Related U.S. Application Data (60) Provisional application No. 61/665,090, filed on Jun. 27, 2012.

(56) References Cited

U.S. PATENT DOCUMENTS

| | | | |
|---|---|---|---|
| 6,905,916 B2 | 6/2005 | Bartsch et al. | |
| 7,528,040 B2 | 5/2009 | Das et al. | |
| 7,851,881 B1 * | 12/2010 | Zhao | H01L 21/0495 257/155 |
| 9,105,557 B2 * | 8/2015 | Konstantinov | H01L 29/872 |
| 2002/0125482 A1 * | 9/2002 | Friedrichs | H01L 21/0485 257/73 |
| 2004/0238809 A1 | 12/2004 | Adamec et al. | |
| 2007/0228505 A1 * | 10/2007 | Mazzola | H01L 29/8611 257/471 |
| 2008/0029838 A1 | 2/2008 | Zhang et al. | |
| 2008/0191304 A1 * | 8/2008 | Zhang | H01L 27/0814 257/471 |
| 2011/0207321 A1 * | 8/2011 | Fujiwara | H01L 21/324 438/663 |
| 2012/0228636 A1 * | 9/2012 | Maeyama | H01L 29/0619 257/77 |
| 2013/0062620 A1 * | 3/2013 | Henning | H01L 29/872 257/77 |
| 2013/0062723 A1 | 3/2013 | Henning et al. | |
| 2013/0161633 A1 | 6/2013 | Nie et al. | |
| 2013/0256650 A1 * | 10/2013 | Yang | H01L 33/22 257/43 |

OTHER PUBLICATIONS

Fujiwara, H. et al., "Impact of Surface Morphology above Threading Dislocations on Leakage Current in 4H-SiC Diodes", ICSCRM, 2011, 2 pages.

* cited by examiner

SCHOTTKY-BARRIER DEVICE AND RELATED SEMICONDUCTOR PRODUCT

RELATED APPLICATIONS

This application is a continuation of U.S. patent application Ser. No. 13/920,933, filed on Jun. 18, 2013, entitled "Schottky-Barrier Device with Locally Planarized Surface and Related Semiconductor Product", which claims priority to and the benefit of U.S. Provisional Application No. 61/665,090, entitled, "Schottky-Barrier Device with Locally Planarized Surface and Related Semiconductor Product", filed on Jun. 27, 2012, both of which are incorporated herein by reference their entireties.

TECHNICAL FIELD

The present disclosure relates to the field of high power semiconductor device technology and, in particular, to high power silicon carbide (SiC) based devices such as a SiC Schottky-barrier power rectifier device and a method of manufacturing such power rectifier devices.

BACKGROUND

Silicon carbide Schottky-barrier devices are high-performance power devices having lower power losses than conventional silicon devices and can operate at higher switching frequencies. SiC presents the advantages of having a high breakdown electric field, high thermal conductivity and high saturated drift velocity of electrons. SiC is a wide bandgap semiconductor and may advantageously be used for manufacturing devices for low-loss power conversion applications, such as rectifiers.

Generally, power rectifier devices may be manufactured from epitaxially grown SiC layers. Epitaxial SiC layers usually present a number of irregularities due to dislocation defects, such as growth pits, hillocks, and growth steps. Such morphology defects may result in regions of electric field concentration increasing the probability of electron tunneling from the Schottky metal into the SiC drift layer, thereby increasing leakage currents at high blocking voltages. High-temperature stages of the manufacturing process of the power rectifier device, such as for example implant anneal, might also result in surface roughening due to diffusion of silicon and carbon along the wafer surface.

The pattern of the electric field concentration depends on the configuration of the irregularities at the SiC surface. A needle-shaped pit, having a relatively narrow width as compared to its depth along the direction of epitaxial growth, may for example cause a high local concentration of the electric field. A shallow pit, having a relatively large lateral extension, may on the other hand result in a smaller extent of electric field concentration. Curvature of radius and depth of the pit, the applied voltage, and the thickness of the doped SiC layer are examples of parameters that may affect the leakage currents of the power rectifier device.

Thus, it would be desirable to provide a power rectifier device, and a corresponding method of manufacturing, wherein a surface of the drift layer has an improved smoothness.

SUMMARY

The present disclosure is related to alleviation of at least some of the above drawbacks of the prior art and to provide an improved alternative to the prior art.

Generally, at least some of the embodiments are related to a high voltage power conversion semiconductor device, in particular a SiC Schottky-barrier power rectifier device, having a surface (of the drift layer) with improved smoothness. Further, at least some of the embodiments are related to a method of manufacturing a power rectifier device with reduced leakage currents.

At least some embodiments include a power rectifier device and a method having the features described herein.

BRIEF DESCRIPTION OF THE DRAWINGS

The above features and advantages, will be better understood through the following illustrative and non-limiting detailed description of preferred embodiments, with reference to the appended drawings, in which.

All the figures are schematic, not necessarily to scale, and generally show parts which are necessary in order to elucidate embodiments, wherein other parts may be omitted or merely suggested.

DETAILED DESCRIPTION

According to at least a first general aspect, a power rectifier device is provided. The power rectifier device includes a drift layer including silicon carbide and a Schottky electrode disposed on the drift layer. The drift layer and the Schottky electrode provide a Schottky contact, wherein the drift layer has a planarized surface such that the depth of any pit of the surface of the drift layer is less than approximately $D_{max}=E_b/F_a$, where $E_b$ is the metal-semiconductor energy barrier height and $F_a$ is the avalanche breakdown field.

According to a second general aspect, a method of manufacturing a power rectifier device is provided. The method can include the forming a drift layer including SiC, forming a sacrificial layer on a surface of the drift layer, transferring the morphology (or structure) obtained in the sacrificial layer to the surface of the drift layer, and forming a Schottky electrode on the drift layer, wherein the Schottky electrode and the surface of the drift layer provides a Schottky contact.

Some embodiments makes use of an understanding that by removing pits having a certain depth, a negligible (or at least reduced) effect of pitting on breakdown performance of the power rectifier device may be obtained. A suitable maximum depth of the pits may be defined as the ratio between the metal-semiconductor barrier energy height and the avalanche breakdown field.

Such a surface may be obtained according to a method of manufacturing in which the surface morphology of a sacrificial layer is transferred to the (pitted) surface of the drift layer. Advantageously, the sacrificial layer has a smoother surface than the original (pitted) surface of the drift layer.

The power rectifier device may be a SiC Schottky barrier power rectifier device, such as a diode, or a semiconductor device including at least one Schottky-barrier junction.

With the term "pit" should be understood as any hollow, hole or indentation in the SiC surface. A pit may be related to a morphological defect, e.g. a crystallographic dislocation such as a screw dislocation and an edge dislocation occurring during epitaxial growth of the substrate, or a post-growth defect caused by processing (subsequent to epitaxial growth) such as diffusion of carbon and silicon atoms during anneal, or ion bombardment induced damage.

A pit may include an aperture located at the surface of the drift layer and extend via side walls to an opposite bottom. The pit may extend in the drift layer in the direction of epitaxial growth and the length of the extension may be referred to as the depth of the pit. The lateral extension of the aperture may be referred to as the width of the aperture and may be circular or of any other shape. The bottom of the pit may for example be flat, or form a sharp angle defined by the tapering of the sidewalls. The bottom of the pit may also be defined by a width, or a radius of curvature. The depth of the pit, the width of the aperture and the bottom, and the tapering of sidewalls, define the shape of the pit.

As the Schottky electrode is disposed on the drift layer, the metal may partly or fully fill up a pit and thereby create a metal projection in the semiconductor material. The shape of the portion jutting out from the metal layer may correspond to the shape of the pit and defines the electric field concentration.

Reverse currents of power rectifier devices are dominated by tunneling which is affected by barrier height and the surface morphology at the metal-semiconductor interface. Pits at the surface, extending into the drift layer, may cause electric field concentrations in the drift layer, which increases the probability of electron tunneling.

According to some embodiments, the probability of electron tunneling in a power rectifier device is significantly reduced if pits deeper than $E_b/F_a$ nanometers are removed. The maximum Schottky metal indentation into the semiconductor may be limited and thereby the probability of electron tunneling, and its effect on breakdown performance of the power rectifier device, is reduced.

The Schottky metal may for example be sputtered or evaporated titanium, tungsten, or molybdenum.

According to an embodiment, the depth of any pit of the surface of the drift layer smaller than approximately 2 micrometers in diameter or size may be less than approximately 5 nanometers. Pits of such shape may not be sufficiently narrow and deep to create an electric field concentration that is high enough to eliminate the barrier height. The embodiment is therefore advantageous in that it reduces the effect of pitting on electrical breakdown performance of the power rectifier device.

According to an embodiment, the power rectifier device may include a junction termination region at its an outer periphery, which is advantageous in that it reduces the electric field crowding at the device edge and thereby reduces the risk of early electrical breakdown. The termination region may for example comprise a continuous belt provided around the periphery of the device.

According to an embodiment, the drift layer of the power rectifier device includes an array of p-type regions (depletion stoppers, or field stoppers), which advantageously may shield the Schottky-barrier metal from exposure to high electric field. The p-type regions may advantageously be arranged in an array. Examples of p-type dopants include for example aluminum and boron.

According to an embodiment, the drift layer of the power rectifier may comprise a near-surface portion provided with a doping being 1.5 to 8 times higher than the doping of the remaining part of the drift layer. The depth of the near-surface portion of the drift layer may be approximately equivalent to the depth of the p-type depletion stoppers.

According to an embodiment, the power rectifier device may advantageously have an outer periphery provided with a depletion stopper region. The depletion stopper region, such as a p-doped region, may be arranged to prevent a depletion region of the power rectifier device from reaching an edge of the device during voltage blocking.

According to one embodiment, the power rectifier device may include an array of surge pn diodes distributed within a region as defined by the junction termination region, and wherein any of the surge pn diodes is provided with an Ohmic contact and has a minimum lateral extension of two times the thickness of said drift layer.

According to one embodiment the drift layer may advantageously be of n-type conductivity.

According to an embodiment, the step of transferring the morphology obtained in the sacrificial layer to the surface of the drift layer may include removing the sacrificial layer using an etching process. Etching is advantageous over other material removing processes, such as for example grinding or polishing, in that it does not expose the wafer (or at least expose it less) for mechanical working and may allow for a thorough control of material removal.

Etching processes are also advantageous in that they allow for a selective planarization of the wafers. The wafer may for example be provided with a relatively thick oxide mask that protects certain regions, such as ion implanted regions, and leaves the intended Schottky regions exposed. In this way the implanted regions may be protected during the planarization such that a local planarization is obtained without affecting the depth of the implanted regions. This is particularly advantageous for SiC devices, which might have a relatively shallow implantation depth and therefore might be sensitive for excessive material removal.

According to an embodiment, the etching process may be a plasma etch, such as an inductively-coupled plasma (ICP) etch.

According to a further embodiment, the etching process may have a selectivity between the sacrificial layer and the SiC in the range of 0.9 to 1.1. The selectivity represents the ratio of etch rates between the two materials.

Using an etch process which etches SiC and the sacrificial layer at almost the same etch rate, such as e.g. in the range of 0.9 to 1.1, is advantageous in that it enables a transfer of the surface morphology of the sacrificial layer into the surface of the drift layer. During the thinning of the sacrificial layer by etching, protruding surface regions of the drift layer will gradually be exposed to the etching process and etched at essentially the same rate as the sacrificial material. Prominent surface irregularities may thereby be replaced with the corresponding surface morphology of the sacrificial layer, and by continuing the etching further also hollow irregularities, such as pits and holes, are replaced. Providing that the sacrificial layer has a smoother morphology than the initial surface of the epitaxially grown drift layer, such a process improves the morphology of the drift layer.

According to an embodiment, the sacrificial layer may be a silicon dioxide layer, which is suitable for integration in the manufacturing process of semiconductor devices. The oxide may for example be applied by depositing a spin-on glass, which is advantageous in that it may be applied in various coating thicknesses by using a process similar to what is used for applying photoresist.

Further, the liquid nature of spin-on glass enables it to completely fill cavities and pits having a relatively small radius of curvature. A smaller radius of curvature increases the risk of breakthrough due to electric field concentration. A pit having a small radius of curvature may on the other hand be easier to completely fill up with spin-on glass, which is advantageous in that it enhances the possibility of removing the pit during planarization (via etching). Using spin-on glass might also provide a relatively smooth surface due to the forces of surface tension of the spin-on glass.

Other deposition techniques include for example chemical vapor deposition (CVD).

Using an oxide is also advantageous in that it may be etched by different kinds of etch processes that may be used at other stages of the processing of semiconductor devices and which processes have a low selectivity between oxide and silicon carbide.

Yet a further advantage with using a dielectric sacrificial layer, such as an oxide, is that remnants after a completed etch process may be relatively easily detected. Complete removal of the sacrificial layer may for example be verified by inspection via scanning electron microscopy (SEM).

Examples of etch processes having a low selectivity between sacrificial oxide layer and silicon carbide include inductively-coupled plasma (ICP) etch in sulfur hexafluoride ($SF_6$) and argon (Ar) gas mixture, electron cyclotron resonance (ECR) plasma etch, parallel-plate reactive ion etch (RIE), and ion milling.

According to an embodiment, the method of manufacturing a power rectifier device may further comprise chemical mechanical polishing (CMP) of the surface of the sacrificial layer prior to transferring the morphology of the surface of the sacrificial layer to the surface of the drift layer. The present embodiment is advantageous in that a sacrificial layer having a smoother surface with fewer irregularities such as for example pits and hillocks may be obtained prior to the transfer of morphology.

According to an embodiment, the method of manufacturing a power rectifier device may further comprise a step of annealing the surface of the drift layer prior to forming the Schottky electrode on the drift layer. The present embodiment is advantageous in that the annealing (i.e. heating) of the wafer may remove ion damage stemming from the plasma etch of the sacrificial layer and thereby provide an improved drift layer surface having a reduced number of morphology defects that otherwise may impair the performance of the device.

The heat treatment may for example be a rapid thermal processing (RTP).

According to an embodiment, the method of manufacturing a power rectifier device may further comprise the step of polishing the surface of the drift layer after the step of transferring the morphology of the sacrificial layer to the surface of the drift layer, and before the step of forming the Schottky electrode. The present embodiment is advantageous in that the polishing may further decrease the microscopic roughness of the surface of the epitaxial layer so as to form an ordered structure of monolayer steps which might improve the deposited Schottky-barrier and reduce the amount of leakage currents.

The polishing may for example be performed by CMP.

According to an embodiment, the method of manufacturing a power rectifier device may further comprise (the subsequent steps of) oxidizing and hydrofluoric acid (HF) etching the surface of the drift layer prior to forming the Schottky electrode on the drift layer. The oxidizing may for example be performed during RTP anneal in an environment comprising oxygen which may react with some of the surface material (Si atoms) to form silicon dioxide. The oxide may then be removed by HF-etching, for example immediately prior to deposition of the Schottky metal, which is advantageous in that it provides a Schottky-barrier junction with an improved smoothness.

According to an embodiment, the method of manufacturing a power rectifier device may further comprise the step of implanting dopant atoms in the drift layer subsequent to the step of forming the drift layer. The implanted regions may form for example a JTE zone, a mesh of depletion stoppers, and an array of pn diodes.

Performing the implantation prior to the transferring of the morphology of the sacrificial layer to the surface of the drift layer is advantageous in that surface damages induced by the implantation and/or irregularities induced during anneal of the drift layer might also be reduced.

According to an embodiment, the method of manufacturing a power rectifier device may further comprise the step of implanting dopant atoms in the drift layer preceding (or before) the step of forming a Schottky electrode on the drift layer.

It will be appreciated that any of the features in the embodiments described above for the power rectifier device according to the first aspect may be combined with the method according to the second aspect.

Further features of, and advantages with, are described in the detailed disclosure below, the drawings and the appended claims. Those skilled in the art will realize that different features can be combined to create embodiments other than those described in the following.

Figure 1:
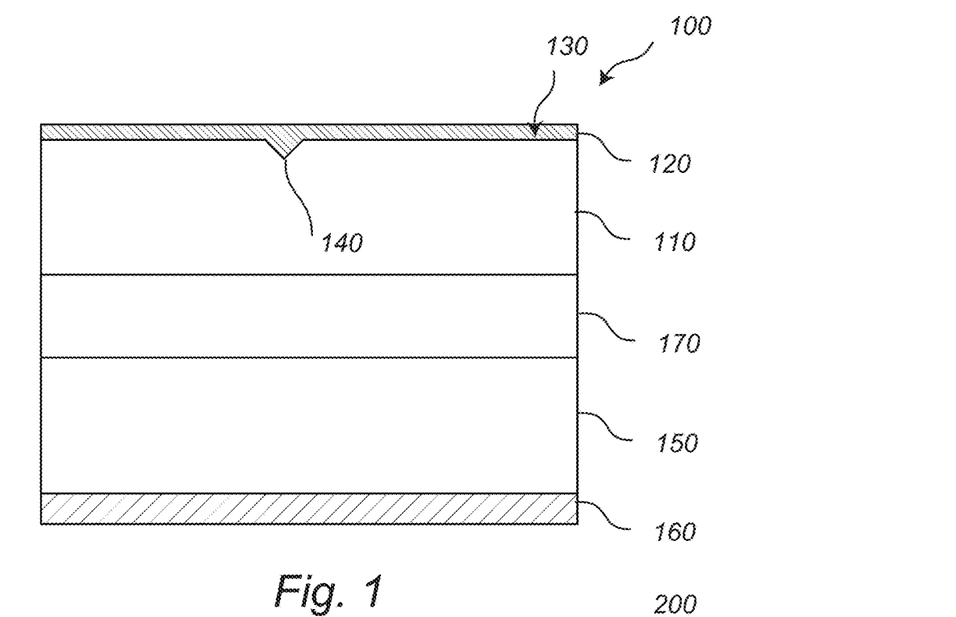
FIG. 1 schematically shows a cross section of a power rectifier device according to an embodiment.

With reference to FIG. 1, there is shown a schematic view of a power rectifier device according to an embodiment.

The power rectifier device 100 comprises a silicon carbide drift layer 110 which is epitaxially grown on for example a 4H polytype substrate 150 having an off-axis orientation of for example 2 to 8 degrees. A Schottky electrode 120 comprising for example titanium is disposed on the drift layer 110. An Ohmic contact 160 is attached to the backside of the low-resistivity substrate 150. The drift layer 110 has a planarized surface (i.e. a surface being planar or flat) such that the depth of any pit 140 of the surface of the drift layer 110 is less than approximately $D_{max}=E_b/F_a$, where $E_b$ is the metal-semiconductor barrier height and $F_a$ is the avalanche breakdown field.

A pit 140 of the surface of the drift layer 110 may cause the formation of a metallic needle propagating into the semiconductor upon metal deposition. A small-radius metal tip might lead to a high local concentration of the electric field which generally increases with a decreasing radius of curvature of the metal indentation. A high probability of electron tunneling from the Schottky metal 120 into the semiconductor may limit the thermal barrier for current flow from the metal to the semiconductor and hence the effective barrier energy is lowered. The energy barrier between the metal and the semiconductor may however be maintained as long as the maximum decrease of the barrier height due to the metal indentation does not exceed the metal-semiconductor barrier height $E_b$. The maximum mean electric field in the semiconductor is limited by the avalanche breakdown field, $F_a$. Any metal indentation being not deeper than $D_{max}=E_b/F_a$ may therefore not decrease the barrier height to zero.

Values of the metal-semiconductor barrier height $E_b$ and the avalanche breakdown field $F_a$ might for example be 1 eV and 2 MV/cm, respectively. Hence, according to an embodiment, any pit no deeper than approximately 5 nm might ensure a negligible (or at least significantly reduced) effect of pitting on the breakdown performance of the power rectifier device 100.

Shallow indentations, having a depth of less than 5 nm and a lateral dimension (or width) above approximately 2 μm might, according to the present embodiment, retain on the surface due to their relatively large radius of curvature. With regard to FIG. 1, it can be noted that the depth of the remaining pit 140 on the surface of the drift layer is not to scale by orders of magnitude. The drift layer may be provided a thickness of approximately 0.7 to 1.1 μm per 100V of desired voltage. Advantageously, the doping of the drift layer 110 may be sufficiently low to provide a maximum electric field at the rated blocking voltage below the critical field of avalanche breakdown in 4H SiC.

Figure 2:
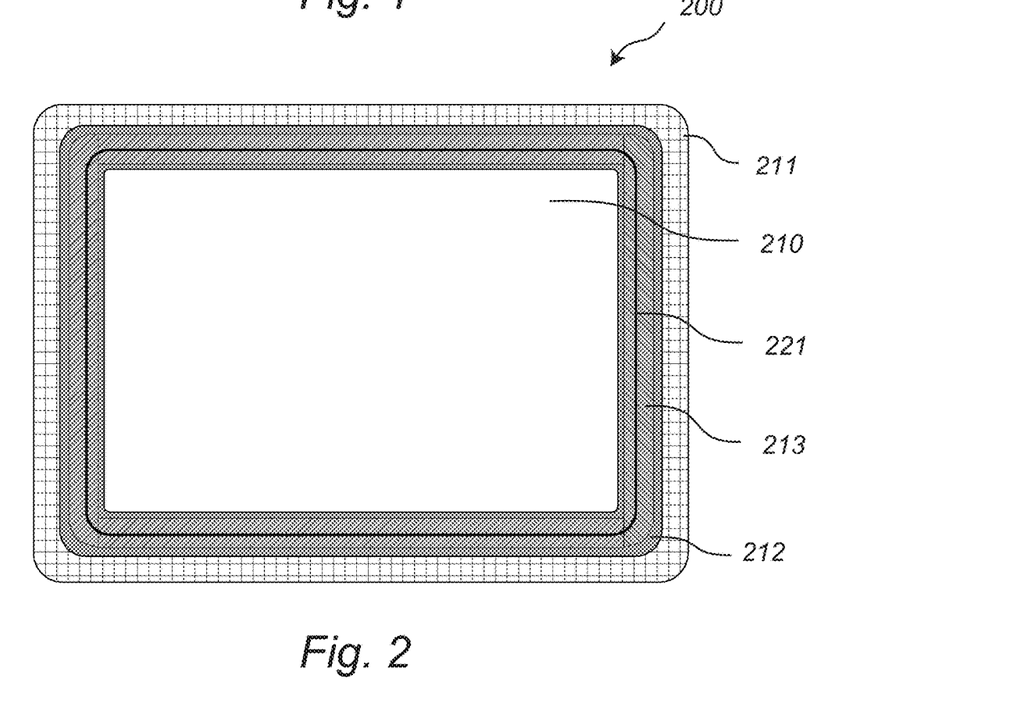
FIG. 2 schematically shows a top view of a rectifier device according to an embodiment.

Advantageously, the device periphery of a high power rectifier may be protected from electric field crowding effects. As shown in FIG. 2, the outer periphery of the power rectifier device 200 may be provided with an ion-implanted p-type depletion stopper region 212 and a junction termination (JT) region 211 that may suppress the spike of electric field at the outer periphery of the power rectifier device 200. Both regions 211, 212 may be formed as a continuous belt enclosing the power rectifier device 200.

A p-type Ohmic contact 213 may be provided to the depletion stopper region 212, which advantageously may enable for the potentials of the Schottky metal 120 and of the inner periphery of the JT region 211 to be approximately equal. The outer periphery 221 of continuous Schottky metal (only the outline 221 is shown in FIG. 2) may fully overlap the surface of the drift layer 210, and may further be located within the Ohmic contact region 213.

The JT region 211 may be formed, for example by implanting acceptors with a dose of approximately $10^{13}$ cm$^{-2}$, so as to form a junction termination extension (JTE). It will be appreciated that other junction termination techniques than the use of a JTE may be applied. As an example, an array of floating guard rings may be used as a junction termination.

Figure 3:
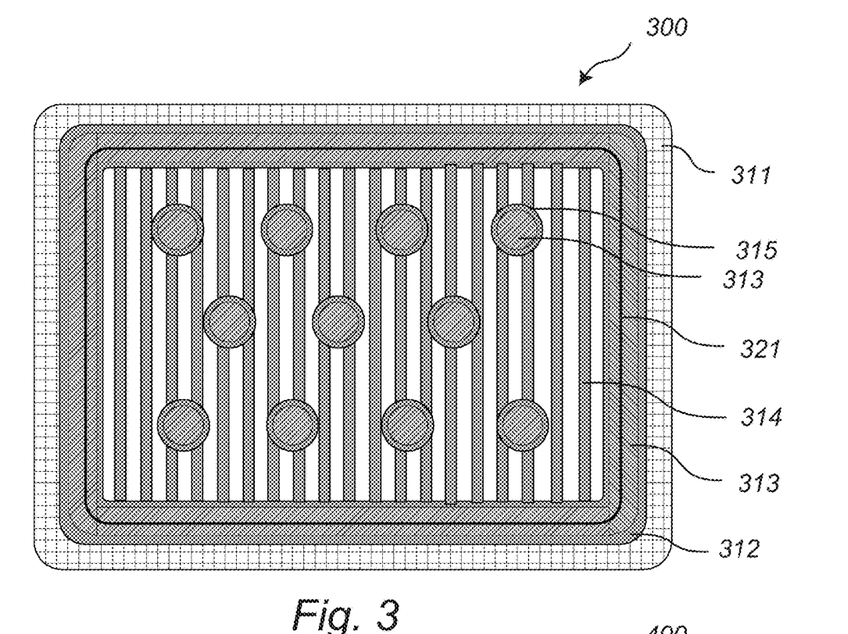
FIG. 3 schematically shows a top view of a power rectifier device according to another embodiment.

With reference to FIG. 3, the power rectifier device may be provided with a closely spaced array of ion-implanted p-type depletion stoppers 314 underneath the Schottky metal 120. The closely-spaced array may provide electrostatic shielding to the Schottky-barrier. The electric field at the metal-semiconductor interface of the device according to this embodiment may advantageously be lower than that in a non-shielded power rectifier device. Reverse currents in SiC Schottky diodes are governed by tunneling, and therefore decreasing the electric field at the Schottky interface might be advantageous. A close spacing between adjacent depletion stoppers 314 may enable electrostatic shielding.

Advantageously, the maximum spacing between said closely spaced adjacent depletion stoppers may not exceed approximately 6 times the p-dopant penetration depth, which might provide substantially high shielding. This relation may for example correspond to a range of the spacing between adjacent p-type depletion stoppers 314 of approximately 1 to 5 micrometers, depending on the penetration depth in SiC.

The top portion of the drift layer 110 in the shielded power rectifier device design 300 may have a function similar to that of channels in vertical field-effect transistors. The total area of the channels may be substantially smaller than the total Schottky metal area, as a portion of the total area may be consumed by the depletion stoppers 314. An additional portion of the useful power rectifier device cross-section area might be consumed by the regions adjacent to the depletion stoppers 314 due to said adjacent regions being depleted by the built-in potential of the pn junctions. Advantageously, the near-surface portion of the of the drift layer 110 may have a doping level increased by a factor of 1.5 to 8 as compared to the doping level of the main body of the drift layer 110. The thickness of said near-surface channel portion may be approximately equal (close) to the implant depth of the p-type depletion stoppers 314.

Advantageously, the width of the ion-implanted p-type depletion stoppers 314 may not exceed the spacing between them since the device area consumed by the depletion stoppers 314 may not be used for vertical transport of electrons from the anode to the cathode.

The power rectifier device 300 may further be provided with an Ohmic contact 160 at the backside of the substrate 150. The epitaxial layer stack may further comprise a buffer layer 170 which may suppress the effect of substrate crystal imperfection on crystal quality of the drift layer 110.

According to one embodiment, the power rectifier device may be further provided with a number of relatively large surge-current pn diodes (surge diodes) 315 distributed over the area of the drift layer 110. The surge diodes 315 may utilize the same type of p-implant and Ohmic contact as the outer p-type region 312. All the surge diodes 315 may be fully covered by the Schottky-barrier metal.

The device 300 may be provided with further safety features for the case of current surge conditions. A pn diode portion along the rim of devices 200 and 300 may provide such safety feature, since a pn junction may retain a relatively low forward drop under high current densities due to minority carrier injection. However, the total area of the rim might be relatively small, which may enable the device 200 of being capable of maintaining a relatively low current surge. The array of surge diodes 315 may distribute the surge current over a much larger area, which therefore might provide a device 300 with higher stability to current surge. Advantageously, the smallest lateral dimension of a surge diode 315 may exceed two (2) times the thickness of the drift layer 110. Surge diodes of smaller area may be shorted by adjacent Schottky-barrier regions, which in silicon carbide may have smaller turn-on voltage than the pn diode.

The fraction of Schottky-barrier diode area utilized by the surge diodes 315 may be chosen according to application-specific requirements. Too dense a surge diode array might consume a high percentage of the drift layer area, whereas too loose an array might have low value of acceptable surge current.

The surge diode array is not limited to an array of circular diodes. Different configurations of surge diodes may be applied, such as for example a linear array of pn diode stripes having a stripe width exceeding two (2) times the thickness of the drift layer.

The power rectifier device may comprise closely spaced depletion stoppers 314 or an array of surge diodes 315 distributed over the Schottky diode area, or a combination of both as shown in FIG. 3. The device may also be provided with a JTE region along the entire periphery.

Figure 4:
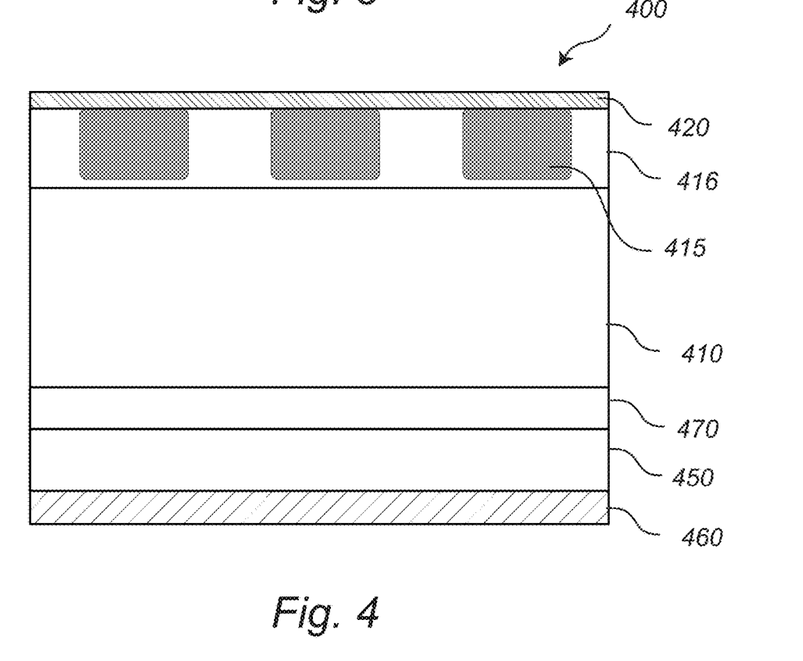
FIG. 4 is a schematic cross section of a power rectifier device according to an embodiment.

FIG. 4 shows a cross section of a power rectifier device having a backside Ohmic contact 460, provided on the substrate 450, and a buffer layer 470 provided between the substrate 450 and the drift layer 410. A dedicated array of surge diodes 415, having a minimum dimension of a surge diode 415 exceeding approximately two (2) times the drift layer 410 thickness, may be provided in the near-surface portion 416 of the drift layer 410 in order to provide improved protection against surge current conditions. Each surge diode 415 may be provided with an Ohmic contact.

FIGS. 5a to 5d schematically illustrate an example embodiment of a method of manufacturing a power rectifier device.

Figure 5A:
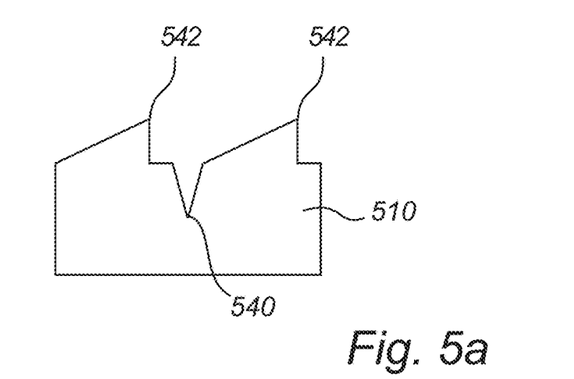
FIGS. 5a-5d schematically show a planarization process of a power rectifier device according to an embodiment.

In FIG. 5a, a drift layer 510 including SiC is provided. The drift layer may be epitaxially grown on a SiC substrate 150. The top surface of the drift layer 510, onto which the Schottky electrode 120 will be provided, comprises irregularities such as pits 540 and steps 542 formed for example during epitaxial growth of the drift layer 510 and during subsequent processing of the substrate 150. The irregularities might increase the risk of leakage currents caused by electron tunneling due to local concentration of the electric field.

Figure 5B:
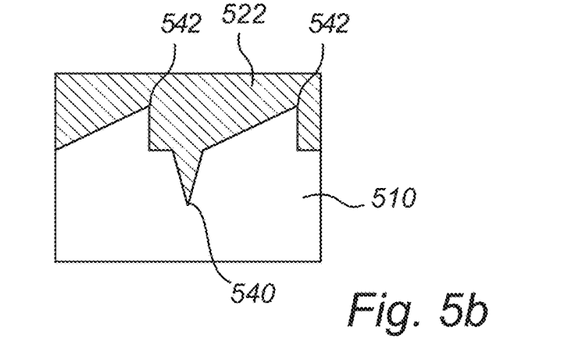

As illustrated in FIG. 5b, a sacrificial layer 522, such as for example $SiO_2$, may be provided by deposition of a spin-on glass on the surface of the drift layer 510. Spin-on glass is a type of glass that can be applied as a liquid and cured to form an oxide layer on the surface. Due to its liquid characteristics, the spin-on glass may fill the cavities of the drift layer 510 and provide a smoothened surface. Spin-on glass layers can be obtained with a coating thickness of about 50 nm. However, both thinner and thicker coatings may be used for forming the sacrificial layer 522.

The spin-on glass may be applied using a technique similar to conventional application of photoresist, i.e. spinning and baking, followed by a subsequent curing step.

The formation of the sacrificial layer 522 may be followed by a low-selectivity plasma etch, such as for example an inductively-coupled plasma (ICP) etch in $SF_6$ and Ar gas mixture. Accordingly, SiC and $SiO_2$ may be etched at substantially the same etch rate, which enables a transfer of the morphology obtained on the sacrificial layer 522 to the surface of the drift layer 510.

Figure 5C:
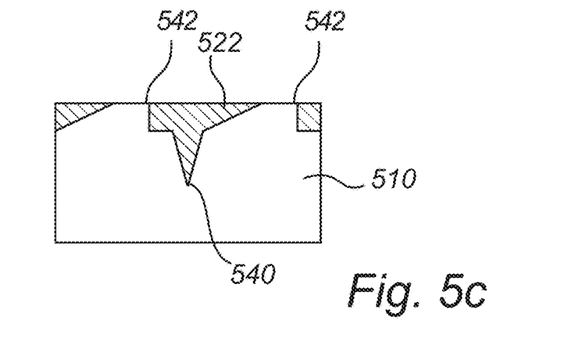

As shown in FIG. 5c, any protruding parts of the surface of the drift layer might eventually be exposed to, and etched by, the plasma during the progress of the etching process.

Figure 5D:
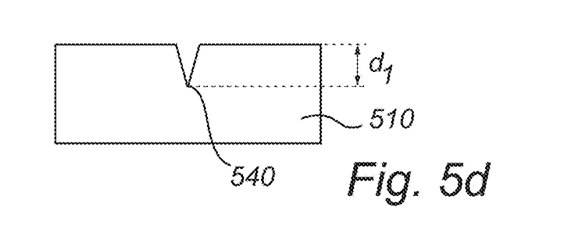

FIG. 5d shows a planarized surface wherein the etching process has continued until the sacrificial layer 522 has been removed from the deepest indentation. All irregularities but the lower part of the pit 540 is removed. As a result, the surface is smoother than before the planarization was initiated and in particular smoother than as-grown. The present method of manufacturing is advantageous on that it may only retain pits 540 no deeper than approximately 5 nm (indicated $d_1$ in FIG. 5d), which have a reduced effect on the resulting breakdown performance of the power rectifier device 100. The surface morphology of the sacrificial layer 522 has been transferred to the surface of the drift layer 510.

The planarization as described above may also be repeated in order to further enhance the surface smoothness, which is particularly advantageous if an etching process having a higher selectivity between the sacrificial layer 522 and the SiC, such as for example 0.7, is used.

Figure 6A:
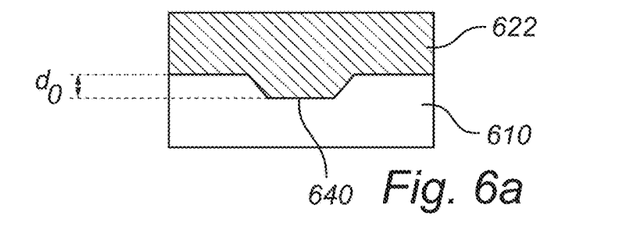
FIGS. 6a-6b schematically illustrate a pit of a surface of the drift layer before and after a planarization etch.
Figure 6B:
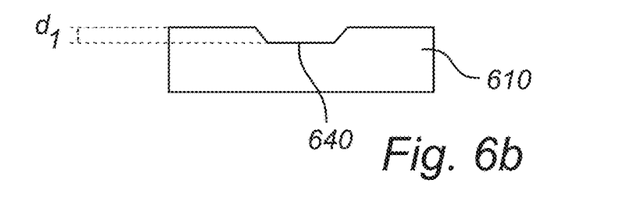

FIGS. 6a and 6b show a surface of the drift layer 610 having a 40 nm deep pit 640. A single planarization cycle using a plasma etch having an oxide-SiC selectivity of 0.9 will decrease the depth $d_0$ of the pit 640 to approximately 4 nm (FIG. 6b) which may be sufficient to eliminate the undesirable electric field concentration effects. By repeating the procedure, i.e. adding and etching a second sacrificial layer 622 on top of the drift layer 610, the pit depth $d_1$ might decrease further. Optionally, the number of planarization cycles may be further increased if required. For example, this might be advantageous if the selectivity of the planarization etch (substantially) deviates from 1.

After the planarization etch in which the morphology of the sacrificial layer 622 is transferred to the surface of the drift layer 610, a scanning electron microscope (SEM) may be used to verify that all oxide 622 has been removed.

Actual depth of the remained pits 640 may be monitored utilizing characterization techniques such as for example Atomic Force Microscopy (AFM) or Tunnel Microscopy.

Figure 7:
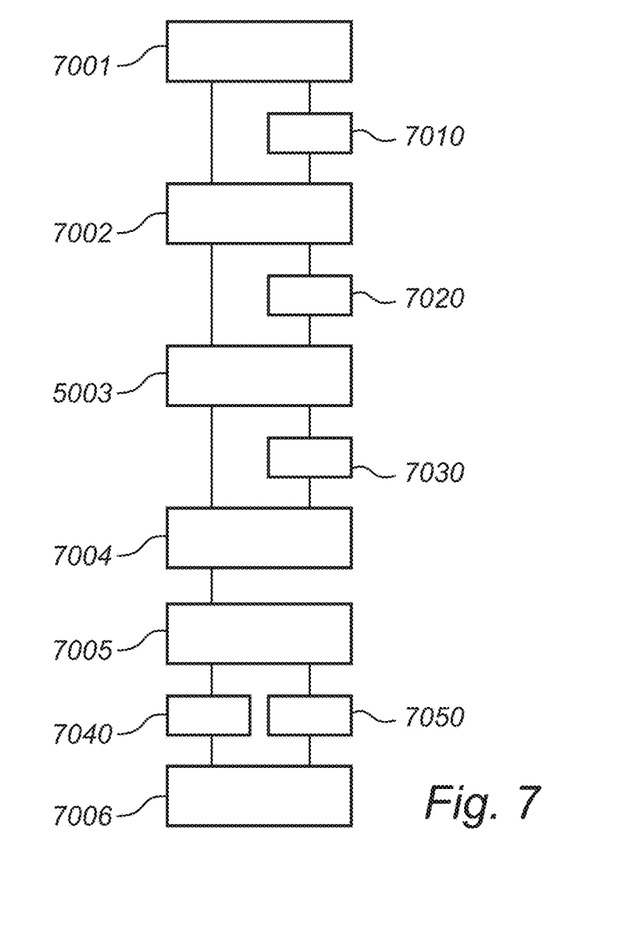
FIG. 7 is a block diagram illustrating a method of manufacturing a power rectifier device according to an embodiment.

FIG. 7 is a block diagram schematically showing the method of manufacturing a power rectifier device according to an embodiment.

A drift layer is formed 7001 on a wafer comprising a substrate as described above. The formation 7001 may be followed by an implantation step 7010, wherein for example aluminum may be ion implanted to form p-type regions in the drift layer.

A sacrificial layer is then formed 7002 on the drift layer and may be CMP polished during a polishing step 7020 in order to further improve the morphology of the surface such that a smoother surface with reduced irregularities is formed.

A step of etching 7003, or transferring of the morphology of the sacrificial layer into the drift layer, may be followed by an inspection step 7030 using SEM. This inspection step 7030 may be added to verify removal of the sacrificial layer.

For further reducing any surface irregularities and damages that might have been induced by the etching process an anneal step 7004 may follow the etch process. The wafer may be heated to a temperature between 900° C. and 1300° C. in an environment containing oxygen such that the surface becomes oxidized. If the surface is a silicon crystal face of the SiC, the oxide may be for example 1-2 nm, while it may be a few tens of nanometers or thicker for a carbon face of SiC. The oxide may then be removed by an HF etch 7005.

The metal deposition 7006 may be preceded by an ion implantation 7040 of aluminum, wherein a mesh of p-type depletion stoppers and/or an array of pn diodes are formed in the drift layer. The surface may also be polished 7050 to reduce any remaining defects, wherein for example 10-20 nm of the surface is removed.

In one example, the manufacturing of a pn diode comprises the steps of growing an n-type SiC layer on a p-substrate having an etched trench, deposition of sacrificial oxide, CMP of the oxide, and planarization etch. A smoother pattern obtained by dishing of the oxide in course of CMP in the centre of the trench may be transferred into the SiC.

In one example, a CVD oxide having a thickness of 100-200 nm may be deposited and patterned so as to mask the implanted p-type layer. Spin on-glass having a thickness of 60 nm may then be deposited and baked at 250° C. and followed by a planarization etch to remove the spin-on glass in the central part of the device. Ion damage might then be annealed, and backside Ohmic contact provided by cleaning the wafer backside from oxide, depositing nickel and sintering it at 960° C.

The remaining oxide may then be stripped in HF and followed by anneal of implantation. Optionally, the surface may be further improved by CMP according the embodiment, described above, wherein the method of manufacturing the power rectifier device further comprises polishing the surface of the drift layer after the step 7003 of transferring the morphology of the sacrificial layer to the surface of the drift layer.

Ti Schottky metal may then be deposited, followed by application of Al bonding pad metal to the front side (device side), and application of gold solder metal to the back side.

A planarization of implanted SiC surface according to embodiments is advantageous, since it enables removal of only a small thickness of SiC. As a result, a thorough control of material removal may be achieved in order to not affect the depth of implanted p-well too much.

Planarization may be performed in two stages, wherein the first stage removes growth pits 10 on the as-grown epitaxial wafer and the second planarization stage may be applied after anneal of the acceptor implant so as to remove the surface imperfections that might have appeared as a result of the activation anneal. The shielded design of the device according to this embodiment may favor the use of a metal having a lower barrier to SiC, such as tungsten (W) or molybdenum (Mo). Such metals might result in a barrier height of approximately 800 mV compared to the 1200 mV barrier height provided by Ti annealed at 400-450° C. The lower barrier height of W or Mo may result in a lower forward voltage drop. A lower current leakage may be achieved via the electrostatic shielding combined with the locally planarized surface.

In one example, an array of pn diodes directed in parallel to the power rectifier device 1 may cover approximately 10% to 30% of the Schottky-barrier area.

A high-dose implant 7010 with a dose above $1 \times 10^{14}$ cm$^{-2}$ may be performed to define the pn diodes and the pn diode rim along a periphery of the Schottky-barrier area. Another implant may be performed to define the JTE region 311 at the rectifier periphery. The width of the JTE 311 may be approximately 20-60 μm, or at least twice the width of the depletion region at the maximum blocking voltage. A metal contact may overlap the JTE 311 by at least a few micrometers. The JTE 311 may comprise a p-type layer with a dopant dose of electrically active acceptors of approximately $1.1 \times 10^{13}$ cm$^{-2}$ The dopant may for example be aluminum which is ion implanted using an implant energy of 300 keV and an implanted dose of $1.65 \times 10^{13}$ cm$^{-2}$. The implant anneal may be performed at 1650° C. for 30 minutes under a carbon capping layer that may be formed by thermal treatment at for example 800° C. of a hard-baked photoresist. After the implantation, the carbon cap may be removed in oxygen plasma. After strip of the carbon layer, a local planarization can be performed as described above in connection to for example FIGS. 5 and 7. An optional CMP planarization step 7040 may be added to further improve the surface morphology.

The pn diode regions may be masked with approximately 200 nm thick oxide so as to avoid undesired removal of the p-type material. The mask for this thicker oxide could be offset by approximately 2-3 μm towards the central part of each p-type region so as to avoid undesired masking of the n-type region.

The backside Ohmic contacts 160 may be formed by sintering Ni as previously described. Wells may be opened in the oxide on the top side (device side) of the wafer in the areas that will be provided with Ohmic contacts. An Al/Ti metal stack may then be deposited and patterned so as to define the Ohmic contacts. The Al/Ti stack may be sintered at approximately 950° C. to form the Ohmic contacts. The compound providing Ohmic behavior of the Al/Ti contact is known to be due to formation of intermetallic compound Ti$_3$SiC$_2$, which may be lattice matched to SiC. The sacrificial oxide 522 may at this stage be fully removed from the top surface in buffered HF, after which the substrates are transferred into a deposition chamber wherein the Ti Schottky metal 120 may be deposited. Device manufacture may then be finalized by depositing and patterning Al pad metal on the top. A silver solder metal may be applied to the wafer backside. The device can also be protected by polyimide.

In another example, a semiconductor template for Schottky-barrier power rectifier manufacture may be provided with a locally planarized surface shortly after epitaxial growth. Local planarization may remove pits having a depth approximately greater than 5 nm, as described in the preceding embodiments. Such a procedure is advantageous in that a starting material having a reduced number of morphology imperfections may be obtained for the manufacturing of Schottky-barrier power rectifiers. Epitaxial wafers according to this embodiment are advantageous in that they may simplify the manufacturing of Schottky-barrier power rectifiers. Silicon carbide wafers may often be defective around the wafer edges, and therefore certain edge exclusion may apply. Substrate regions, typically a few millimeters from the wafer edge, may in many cases not meet the requirements for crystal or surface quality. The present embodiment is advantageous since silicon carbide wafers may contain a certain amount of rough defects, which may cause inevitable failure of any power device incorporating said rough defects. It is not a requirement to fully planarize (or flatten) said rough defects for obtaining the benefits of the present embodiment.

Generally, embodiments may result in semiconductor wafers provided with a low-doped (i.e. $3 \times 10^{14}$ to $6 \times 10^{16}$ cm$^{-3}$) epitaxial layer having a thickness of approximately between 4 and 100 micrometers and a donor doping level corresponding to a theoretical breakdown voltage between approximately 300V and 15 kV. As these layers may suffer much less from pits and other defects, the resulting breakdown voltage corresponds to the breakdown voltage that can be calculated using for the structure-specific doping profiles with use of already known impact ionization rates in 4H SiC.

In one general aspect, a power rectifier device for power conversion applications can include a drift layer including silicon carbide, and a Schottky electrode disposed on the drift layer. The Schottky electrode and a surface of the drift layer providing a Schottky contact, where the drift layer has a planarized surface such that the depth of any pit of the surface of the drift layer is less than approximately $D_{max}=E_b/F_a$, where $E_b$ is the metal-semiconductor barrier height and $F_a$ is the avalanche breakdown field.

In some implementations, the depth of any pit of the surface of the drift layer smaller than approximately 2 micrometers in diameter or size is less than approximately 5 nanometers.

In some implementations, the power rectifier device can include including a junction termination region at its outer periphery.

In some implementations, the power rectifier device can be provided with an array of p-type depletion stoppers.

In some implementations, a near-surface portion of the drift layer is provided with a doping being 1.5 to 8 times higher than the doping of the remaining part of the drift layer, and the depth of the near-surface drift layer portion is approximately equivalent to the junction depth of the p-type depletion stoppers.

In some implementations, the power rectifier can be provided with an array of surge pn diodes distributed within a region as defined by the junction termination region, where any of the surge pn diodes is provided with an Ohmic contact and has a minimum lateral extension of two times the thickness of the drift layer.

In another general aspect a method of manufacturing a power rectifier device can include forming a drift layer including silicon carbide, forming a sacrificial layer on a surface of the drift layer, transferring the morphology obtained in the sacrificial layer to the surface of the drift layer, and forming a Schottky electrode on the drift layer. The Schottky electrode and the surface of the drift layer can provide a Schottky contact.

In some implementations, the transferring of the morphology obtained in the sacrificial layer to the surface of the drift layer includes removing the sacrificial layer using an etching process.

In some implementations, the etching process is a plasma etch.

In some implementations, the etching process has a selectivity between the sacrificial layer and the silicon carbide in the range of 0.9 to 1.1.

In some implementations, the sacrificial layer is an oxide layer.

In some implementations, the method can include polishing of the surface of the sacrificial layer prior to transferring the morphology of the sacrificial layer to the surface of the drift layer.

In some implementations, the method can include annealing the surface of the drift layer prior to forming the Schottky electrode on the drift layer.

In some implementations, the method can include polishing the surface of the drift layer after transferring the morphology of the sacrificial layer to the surface of the drift layer, and before forming the Schottky electrode.

In some implementations, the method can include oxidizing and HF-etching the surface of the drift layer prior to forming the Schottky electrode on the drift layer.

In some implementations, the method can include implanting (7010) dopant atoms in the drift layer subsequent to the forming of the drift layer.

In some implementations, the method can include implanting dopant atoms in the drift layer preceding the forming of a Schottky electrode on the drift layer.

In yet another general aspect, a semiconductor product, can include an n-type silicon carbide substrate having a lightly doped epitaxial n-type drift layer disposed on top of the substrate, where the surface of the epitaxial layer is locally planarized such that any pit is less than 5 nanometers, with a lateral extension of the pit being less than 2 micrometers.

In some implementations, the n-type silicon carbide substrate is a 4H-silicon carbide substrate.

While specific embodiments have been described, the skilled person will understand that various modifications and alterations are conceivable within the scope as defined in the appended claims.

What is claimed is:

1. A power rectifier device, comprising:
 a drift layer including silicon carbide of n-type conductivity;
 a Schottky electrode disposed on the drift layer, the Schottky electrode and a surface of the drift layer providing a Schottky contact;
 an array of p-type depletion stoppers disposed underneath the Schottky electrode;
 an array of surge pn diodes distributed within a region defined by a junction termination region located at an outer periphery of the power rectifier device;
 an additional p-doped region; and
 an Ohmic contact disposed on the additional p-doped region, the Schottky electrode having an outer periphery located within a region of the Ohmic contact.

2. The power rectifier device of claim 1, wherein a maximum lateral spacing between two consecutively arranged p-type depletion stoppers of the array is less than approximately six times a penetration depth of p-dopant of the p-type depletion stoppers in the drift layer.

3. The power rectifier device of claim 1, wherein a lateral width of a p-type depletion stoppers of the array is less than a lateral spacing between two consecutively arranged p-type depletion stoppers of the array.

4. The power rectifier device of claim 1, wherein a lateral spacing between two consecutively arranged p-type depletion stoppers of the array is approximately 1 to 5 micrometers.

5. The power rectifier device of claim 1, wherein a near-surface portion of the drift layer includes a doping being 1.5 to 8 times higher than a doping of a remaining part of the drift layer.

6. The power rectifier device of claim 5, wherein a depth of the near-surface portion of the drift layer is approximately equal to an implantation depth of p-dopant of at least one of the p-type depletion stoppers of the array.

7. The power rectifier device of claim 1, wherein the additional p-doped region is located at an edge of the power rectifier device.

8. The power rectifier device of claim 1, wherein the additional p-doped region forms a continuous belt enclosing the power rectifier device.

9. The power rectifier device of claim 1 further comprising a junction termination region at an outer periphery of the power rectifier device, wherein the additional p-doped region is located within an area delimited by the junction termination region.

10. The power rectifier device of claim 1, wherein the Ohmic contact is a p-type Ohmic contact disposed on the additional p-doped region connecting the Schottky electrode and an inner periphery of a junction termination region arranged at an outer periphery of the power rectifier device.

11. The power rectifier device of claim 1, further comprising a junction termination region at an outer periphery of the power rectifier device.

12. The power rectifier device of claim 1, wherein the drift layer has a planarized surface such that a depth of each of a plurality of pits of the surface of the drift layer is less than approximately $D_{max}=E_b/F_a$, where $E_b$ is a metal-semiconductor barrier height and $F_a$ is an avalanche breakdown field.

13. The power rectifier device of claim 1, wherein any pit of the surface of the drift layer having a diameter or lateral extension of less than approximately 2 micrometers has a depth which is less than approximately 5 nanometers.

14. The power rectifier device of claim 1, wherein the surge diodes extend vertically within a near-surface portion of the drift layer including a doping of 1.5 to 8 times higher than a doping of a remaining part of the drift layer.

15. The power rectifier device of claim 1, wherein at least one of the surge pn diodes from the array of surge pn diodes has a minimum lateral extension of two times a thickness of the drift layer.

16. A power rectifier device, comprising:
 a drift layer including silicon carbide;
 a Schottky electrode disposed on the drift layer, the Schottky electrode and a surface of the drift layer providing a Schottky contact;
 an array of p-type depletion stoppers underneath the Schottky electrode;
 a junction termination region arranged at an outer periphery of the power rectifier device; and an array of surge pn diodes distributed within an area defined by the junction termination region, at least one of the surge pn diodes from the array of surge pn diodes having a minimum lateral extension of two times a thickness of the drift layer.

17. The power rectifier device of claim 16, wherein the surge diodes extend vertically within a near-surface portion of the drift layer including a doping of 1.5 to 8 times higher than a doping of a remaining part of the drift layer.

18. The power rectifier device of claim 16, further comprising an additional p-doped region located at an edge of the power rectifier device within an area delimited by the junction termination region.

* * * * *